(12) United States Patent
Fukumoto et al.

(10) Patent No.: US 8,378,351 B2
(45) Date of Patent: Feb. 19, 2013

(54) THIN FILM TRANSISTOR, DISPLAY DEVICE, AND ELECTRONIC UNIT

(75) Inventors: Eri Fukumoto, Kanagawa (JP); Yasuhiro Terai, Kanagawa (JP); Narihiro Morosawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 145 days.

(21) Appl. No.: 13/078,543

(22) Filed: Apr. 1, 2011

(65) Prior Publication Data

US 2011/0248270 A1    Oct. 13, 2011

(30) Foreign Application Priority Data

Apr. 9, 2010    (JP) ................. P2010-090729

(51) Int. Cl.
*H01L 29/04*    (2006.01)
(52) U.S. Cl. .............. 257/59; 257/72; 257/43; 257/410; 257/637; 257/646; 257/E29.299
(58) Field of Classification Search .................. 257/59, 257/72, 43, 410, 637, 646, E29.299
See application file for complete search history.

(56) References Cited

U.S. PATENT DOCUMENTS

| | | | |
|---|---|---|---|
| 8,247,276 B2 * | 8/2012 | Kondo et al. ............ | 438/151 |
| 2007/0194379 A1 | 8/2007 | Hosono et al. | |

FOREIGN PATENT DOCUMENTS

| | | |
|---|---|---|
| JP | 2007-519256 | 7/2007 |
| JP | 2007-194594 | 8/2007 |
| JP | 2007-258223 | 10/2007 |
| WO | 2005/074038 | 8/2005 |
| WO | 2005/088726 | 9/2005 |

OTHER PUBLICATIONS

Cetin Kilic et al., "n-type doping of oxides by hydrogen", Applied Physics Letters, Jul. 7, 2002, vol. 81-1, pp. 73-75.

* cited by examiner

*Primary Examiner* — Tu-Tu Ho
(74) *Attorney, Agent, or Firm* — K&L Gates LLP

(57) ABSTRACT

A thin film transistor using oxide semiconductor for a channel, which may be controlled such that threshold voltage is positive and may be improved in reliability is provided. The thin film transistor includes a gate electrode, a pair of source/drain electrodes, an oxide semiconductor layer forming a channel and provided between the gate electrode and the pair of source/drain electrodes, a first insulating film as a gate insulating film provided on the oxide semiconductor layer on a side near the gate electrode, and a second insulating film provided on the oxide semiconductor layer on a side near the pair of source/drain electrodes. One or both of the first insulating film and the second insulating film includes an aluminum oxide having a film density of 2.70 g/cm³ or more and less than 2.79 g/cm³.

8 Claims, 10 Drawing Sheets

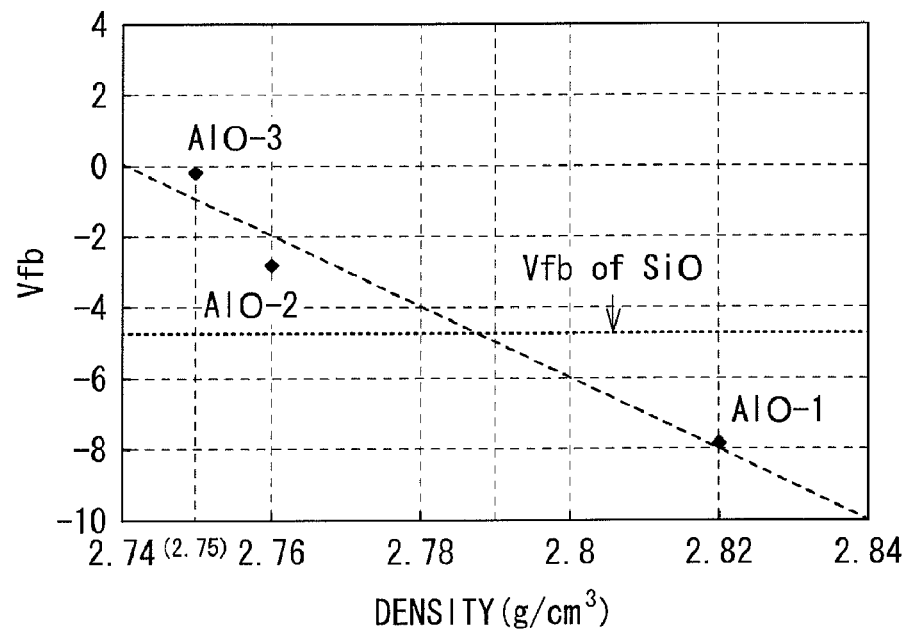
FIG. 3
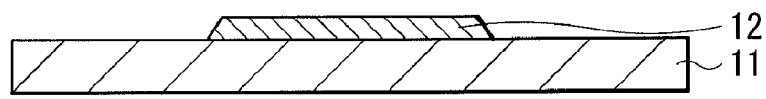
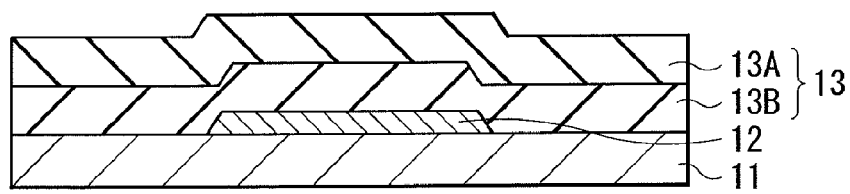
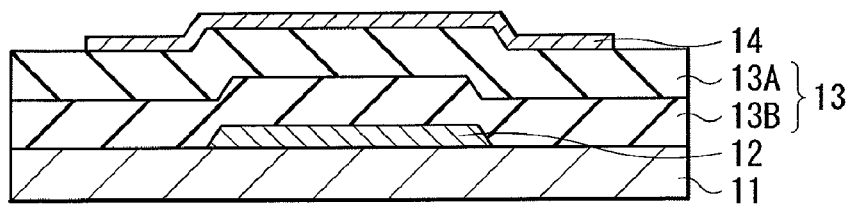

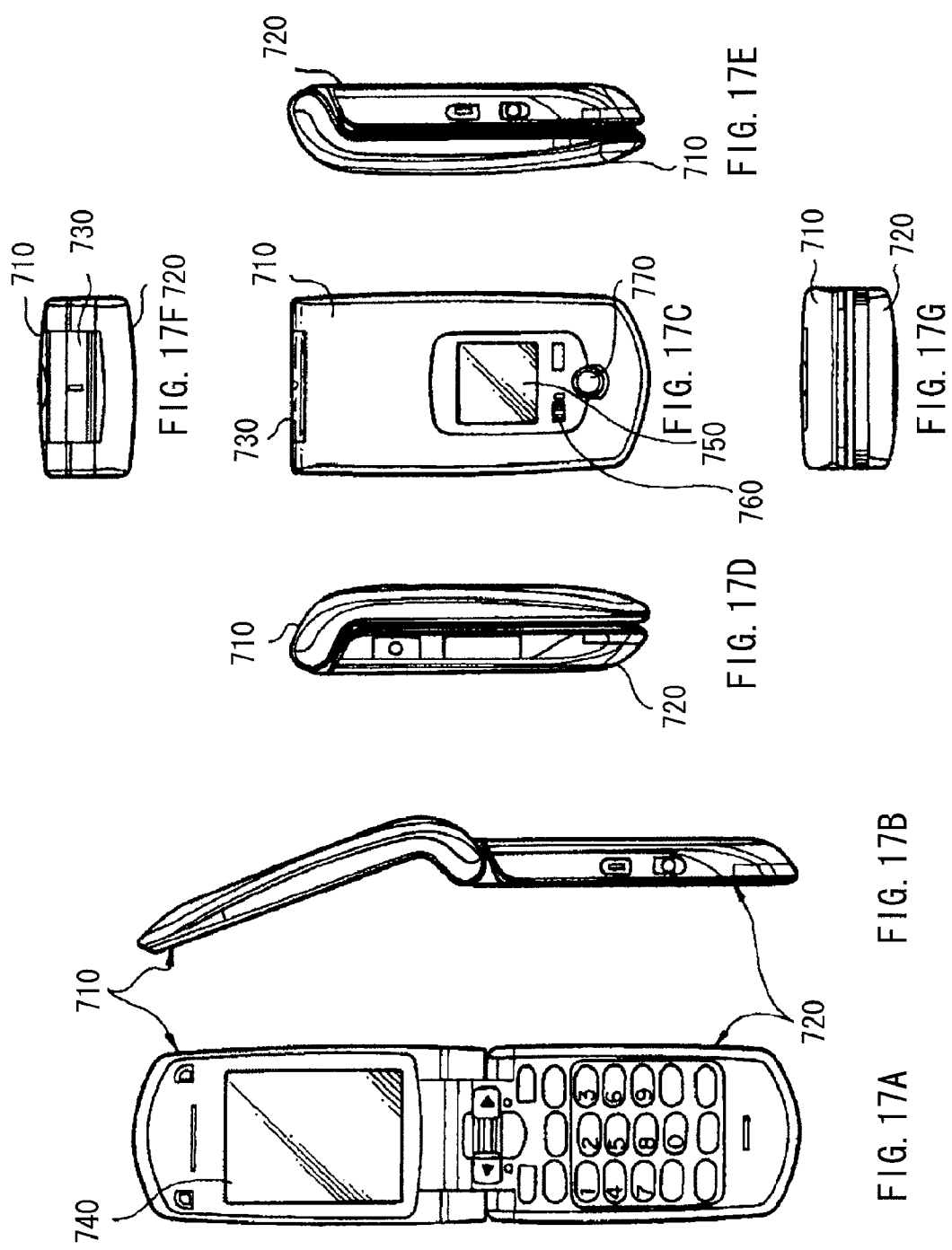

THIN FILM TRANSISTOR, DISPLAY DEVICE, AND ELECTRONIC UNIT

CROSS REFERENCES TO RELATED APPLICATIONS

The present application claims priority to Japanese Patent Application JP 2010-090729 filed on Apr. 9, 2010, the entire contents of which is hereby incorporated by reference.

BACKGROUND

The present disclosure relates to a thin film transistor using oxide semiconductor for a channel layer, and a display device and an electronic unit, which use the thin film transistor.

Recently, research and development of oxide semiconductor such as zinc oxide or indium-gallium-zinc oxide have been actively conducted with the aim of applying the oxide semiconductor to electronic devices such as a thin film transistor (TFT), a light emitting device and a transparent conductive film. As generally known, when such oxide semiconductor is used for an active layer (channel) of TFT, the TFT has high electron mobility and thus has an excellent electric characteristic compared with TFT using amorphous silicon, which is typically used for a liquid crystal display or the like. In addition, the TFT may be advantageously expected to have high mobility even at low temperature near room temperature, and therefore the TFT is being actively developed. As such TFT using the oxide semiconductor layer, TFT having a bottom-gate or top-gate structure has been reported (for example, see WO2005-088726).

A known bottom-gate TFT is structured such that a gate electrode is provided on a substrate, and a thin film layer of oxide semiconductor is formed on the gate electrode via a gate insulating film (for example, see Japanese Unexamined Patent Application Publication No. 2007-194594). Such a structure is similar to a structure of currently commercially used, bottom-gate TFT using amorphous silicon for a channel. Therefore, an existing manufacturing process of the TFT using amorphous silicon may be easily used for manufacture of TFT using oxide semiconductor, and therefore commercialization of the TFT using oxide semiconductor for a channel is gradually progressing.

However, since the oxide semiconductor is not high in heat resistance, oxygen or zinc may be eliminated during heat treatment in a manufacturing process of TFT, resulting in formation of lattice defects, as generally known. The lattice defects cause electrically shallow impurity levels, leading to reduction in resistance of the oxide semiconductor layer. Therefore, use of oxide semiconductor for a channel of TFT leads to normally-on operation, where certain drain current flows though gate voltage is not applied, or depression operation. Consequently, threshold voltage is reduced with increase in defect levels, leading to increase in leakage current. Furthermore, as generally known, similar impurity levels are caused by mixing of a particular element such as hydrogen in addition to the above impurity levels caused by lattice defects (for example, see Cetin Kilic et. al. "N-type Doping of Oxides by Hydrogen" APPLIED PHYSICS LETTERS, 81, 1, 2002, pp. 73-75).

Therefore, a transfer characteristic of TFT has been disadvantageously changed during a manufacturing process or the like, leading to shift of threshold voltage of the TFT in a negative (minus) direction.

For example, when oxide semiconductor is used to form an n-type channel, electron concentration in the channel increases, as a result, threshold voltage of TFT tends to have a negative value. For the TFT using oxide semiconductor, since a p-type channel is hard to be formed, only n-type TFT needs to be used for circuit formation. In such a case, when the threshold voltage has a negative value, a circuit configuration becomes undesirably complicated.

SUMMARY

As a method to overcome such a difficulty, impurity doping is tried in a part of a channel of TFT on an interface between the channel and a gate insulating film of the TFT in order to shift threshold voltage of the TFT (for example, see Japanese Unexamined Patent Application Publication (Translation of PCT Application) No. 2007-519256).

However, impurity doping in a channel may degrade TFT characteristics. Moreover, a channel of oxide semiconductor typically includes a multi-element material deposited by sputtering. When impurity doping in a channel is performed by the sputtering, element ratio control in the channel has been extremely difficult.

It is desirable to provide a thin film transistor using oxide semiconductor for a channel, which may be controlled such that threshold voltage is positive and may be improved in reliability, and provide a display device and an electronic unit, which use such thin film transistors.

A thin film transistor according to an embodiment includes a gate electrode, a pair of source/drain electrodes, an oxide semiconductor layer forming a channel and provided between the gate electrode and the pair of source/drain electrodes, a first insulating film as a gate insulating film provided on the oxide semiconductor layer on a side near the gate electrode, and a second insulating film provided on the oxide semiconductor layer on a side near the pair of source/drain electrodes, wherein one or both of the first insulating film and the second insulating film includes aluminum oxide having a film density of 2.70 g/cm$^3$ or more and less than 2.79 g/cm$^3$.

A display device according to an embodiment includes display elements and the thin film transistors.

An electronic unit according to an embodiment includes display elements and the thin film transistors.

In the thin film transistor according to the embodiment, the first insulating film (gate insulating film) is provided on the oxide semiconductor layer on the side near the gate electrode, and the second insulating film is provided thereon on the side near the source/drain electrodes, and one or both of the first and second insulating films includes aluminum oxide having a film density of 2.70 g/cm$^3$ or more and less than 2.79 g/cm$^3$. Such an insulating film has negative fixed charge and thus negatively charged.

According to the thin film transistor of the embodiment, the insulating film adjacent to the oxide semiconductor layer is formed of aluminum oxide having a film density of 2.70 g/cm$^3$ or more and less than 2.79 g/cm$^3$, and therefore the insulating film has negative fixed charge that may shift threshold voltage of the transistor in a positive direction. Accordingly, while oxide semiconductor is used for a channel, threshold voltage may be controlled to be positive and reliability may be improved.

Additional features and advantages are described herein, and will be apparent from the following Detailed Description and the figures.

BRIEF DESCRIPTION OF THE FIGURES

FIG. 3 is a characteristic diagram showing a relationship between density and Vfb of aluminum oxide.

FIGS. 4A to 4C are diagrams showing a method of manufacturing the thin film transistor shown in FIG. 1 in a step order.

FIG. 14A shows appearance of application example 2 as viewed from a surface side, and FIG. 14B shows appearance thereof as viewed from a back side.

FIGS. 17A to 17G are diagrams of application example 5, where FIG. 17A is a front diagram of the application example 5 in an opened state, FIG. 17B is a side diagram thereof, FIG. 17C is a front diagram thereof in a closed state, FIG. 17D is a left side diagram thereof, FIG. 17E is a right side diagram thereof, FIG. 17F is a top diagram thereof, and FIG. 17G is a bottom diagram thereof.

DETAILED DESCRIPTION

Embodiments will be described in detail with reference to drawings below. Description is made in the following sequence.

Bottom-Gate TFT
1. First embodiment (example of forming channel protective film using low-density aluminum oxide ($Al_2O_3$))
2. Modification 1 (example of gate insulating film having three-layer structure with second layer of gate insulating film using low-density $Al_2O_3$)

Top-Gate TFT
3. Second embodiment (example of forming basecoat film using low-density $Al_2O_3$)
4. Modification 2 (example of forming gate insulating film using low-density $Al_2O_3$)
5. Application examples (examples of display device and electronic units)

FIRST EMBODIMENT

Configuration of Thin Film Transistor 1

Figure 1:
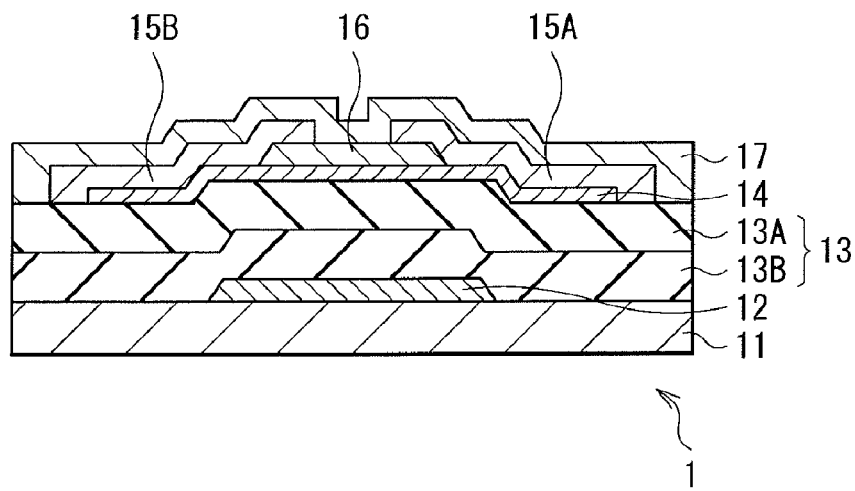
FIG. 1 is a section diagram showing a section structure of a thin film transistor according to a first embodiment.

FIG. 1 shows a section structure of a thin film transistor 1 according to a first embodiment. The thin film transistor 1 is a so-called bottom-gate (inverted-staggered-structure) TFT, which uses oxide semiconductor for a channel (an active layer). The thin film transistor 1 includes a gate electrode 12, a gate insulating film 13, an oxide semiconductor layer 14, a channel protective film 16 and source/drain electrodes 15A and 15B formed in this order on a substrate 11 including glass or the like. A protective film 17 is formed on the source/drain electrodes 15A and 15B over the whole surface of the substrate 11. The gate insulating film 13 corresponds to a specific example of "first insulating film", and the channel protective film 16 corresponds to a specific example of "second insulating film".

The gate electrode 12 controls carrier density (here, electron density) in the oxide semiconductor layer 14 according to gate voltage applied to the thin film transistor 1. The gate electrode 12 includes a single-layer film including, for example, one of molybdenum (Mo), aluminum (Al) and aluminum alloy, or a multilayer film including two or more of them. The aluminum alloy includes, for example, aluminum-neodymium alloy.

The gate insulating film 13 is a single-layer film including one of a silicon oxide film, a silicon nitride film, a silicon oxynitride film, and an aluminum oxide film, or a multilayer film including two or more of them. Here, the gate insulating film 13 has a two-layer structure including a first layer 13A and a second layer 13B, and the first layer 13A is formed of, for example, a silicon oxide film and the second layer 13B is formed of, for example, a silicon nitride film. Thickness of the gate insulating film 13 is, for example, 200 to 300 nm.

The oxide semiconductor layer 14 mainly contains oxide of one or more of elements of, for example, indium (In), gallium (Ga), zinc (Zn), tin (Sn), aluminum and titanium (Ti). The oxide semiconductor layer 14 forms a channel between the source and drain electrodes 15A and 15B in response to application of the gate voltage. The oxide semiconductor layer 14 desirably has such a thickness that on-current of the thin film transistor is not reduced so that effects of negative charge as described later may be exerted on the channel. Specifically, the thickness is desirably 5 to 100 nm.

The source/drain electrodes 15A and 15B include single-layer film including, for example, one of molybdenum, aluminum, copper (Cu), titanium, ITO (indium-tin oxide) and titanium oxide, or a multilayer film including two or more of them. For example, metal or a metal compound having low affinity for oxygen is desirably used for the electrodes, such as a three-layer film including molybdenum, aluminum and molybdenum stacked in this order in a thickness of, for example, 50 nm, 500 nm and 50 nm respectively, or a metal compound containing oxygen such as ITO or titanium oxide. Consequently, an electric characteristic of oxide semiconductor may be stably maintained. On the other hand, when the source/drain electrodes 15A and 15B are formed of metal having high affinity for oxygen, since the electrodes 15A and 15B are formed in contact with the oxide semiconductor, oxygen is extracted from oxide semiconductor, and thus oxygen vacancies are formed, leading to degradation of the electric characteristic.

The channel protective film 16 is formed on the oxide semiconductor layer 14 to prevent damage of a channel during formation of the source/drain electrodes 15A and 15B. Thickness of the channel protective film 16 is, for example, 10 to 300 nm. In the embodiment, the channel protective film 16, which is in contact with the oxide semiconductor layer 14, is formed of low-density aluminum oxide. Generally, aluminum oxide is used not only for the channel protective film 16 but also for an insulating film of a thin film transistor such as a gate insulating film (Japanese Unexamined Patent Application Publication No. 2007-258223). Such insulating films need to have high dielectric strength. For an aluminum oxide film, higher dielectric strength is obtained in a denser (higher-density) film. Therefore, a high-density aluminum oxide film has been used for a thin film transistor in the past. In contrast, negative fixed-charge density tends to increase in thinner (lower-density) aluminum oxide film. In the embodiment, a low-density aluminum oxide film is used to shift threshold voltage of the thin film transistor in a positive direction. A specific density of the aluminum oxide film is preferably less than 2.79 g/cm$^3$. A lower limit of the density is 2.70 g/cm$^3$ in the light of the limit of apparatus used for deposition of the aluminum oxide film. More preferably, the density is 2.75 g/cm$^3$ or more and less than 2.79 g/cm$^3$. The reason for this is described below.

Figure 2:
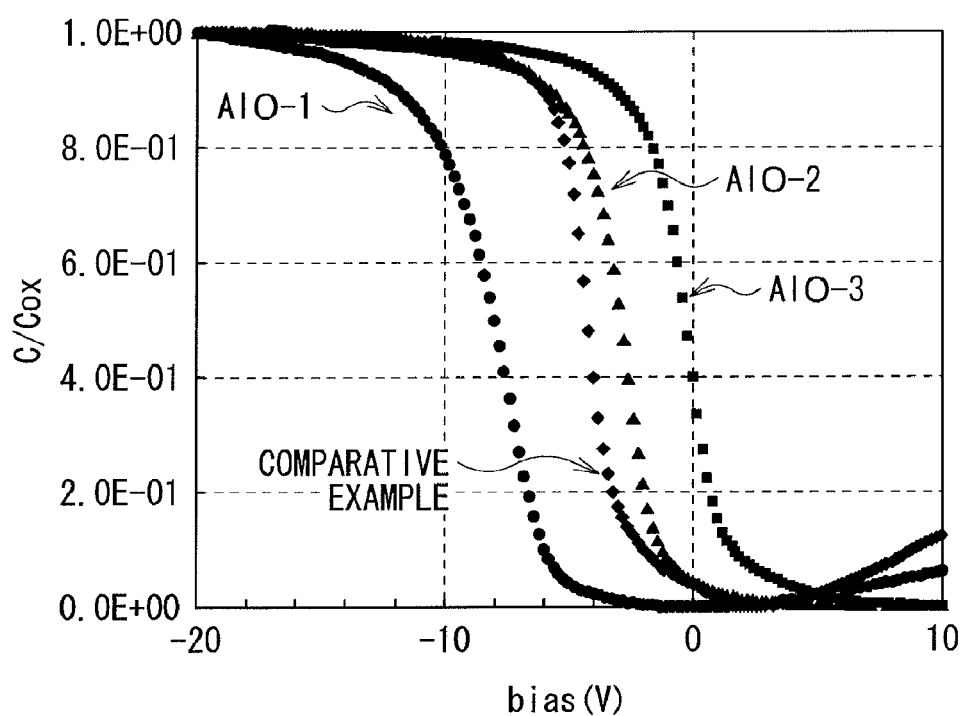
FIG. 2 is a CV characteristic diagram of three kinds of aluminum oxide films having different densities.

FIG. 2 shows CV characteristics of three kinds of aluminum oxide films having different densities. The CV characteristics are obtained through measurement of the aluminum oxide films using a mercury prober, the films being deposited on a p-type silicon wafer at different deposition conditions. The densities of the aluminum oxide films are adjusted by controlling a deposition condition such as temperature. In FIG. 2, AlO-1 indicates a high-density (2.82 g/cm$^3$) aluminum oxide film, which is typically used as an insulating film, formed at 200° C. and DC power of 11 kW. AlO-2 and AlO-3 indicate low-density aluminum oxide films compared with AlO-1, where AlO-2 is formed at 80° C. and DC power of 11 kW, and AlO-3 is formed at 80° C. and DC power of 18 kW. As a comparative example, a CV characteristic of a silicon oxide film is also shown as another insulating film for oxide semiconductor TFT. The silicon oxide film is formed by PECVD (Plasma Enhanced CVD).

As shown in FIG. 2, when flat-band voltages (Vfb) of AlO-1, AlO-2 and AlO-3 are compared to Vfb of silicon oxide, Vfb of AlO-1 exists on a negative side with respect to the Vfb of silicon oxide. On the other hand, Vfb of AlO-2 and Vfb of AlO-3 exist on a positive side with respect to the Vfb of silicon oxide. Whether threshold voltage (Vth) of a thin film transistor is shifted in a positive direction or in a negative direction may be estimated from a value of Vfb. Therefore, it is taught that AlO-2 or AlO-3 having low density compared with AlO-1 is used, thereby Vth of the thin film transistor is shifted in a positive direction. In addition, it is taught that Vth of the thin film transistor may be shifted in a positive direction with respect to Vth of a thin film transistor using silicon oxide.

FIG. 3 shows a relationship between a density and Vfb of each of the aluminum oxide films AlO-1, AlO-2 and AlO-3 deposited at the above conditions. As shown in FIG. 3, Vfb increases with decrease in density of the aluminum oxide film. Therefore, an aluminum oxide film is adjusted to have a density lower than 2.82 g/cm$^3$ corresponding to density of AlO-1 as a typically used aluminum oxide film, thereby Vfb of the film increases, namely, threshold voltage of the thin film transistor is shifted in a positive direction. Furthermore, on the basis of the fact that Vfb of the silicon oxide film as another typical insulating film is −4.6 V, density of the aluminum oxide film is adjusted to be less than 2.79 g/cm$^3$ corresponding to a density at a crossing of a line of an approximation formula obtained from respective Vfb of AlO-1, AlO-2 and AlO-3 and a line of Vfb of the silicon oxide film, and therefore the threshold voltage of the thin film transistor is further shifted in a positive direction.

As described above, density of the aluminum oxide film needs to be less than 2.79 g/cm$^3$ in order to achieve an enhancement-mode thin film transistor (Vth>0). However, such a lower-density aluminum oxide film is low in barrier capability. Therefore, a density gradient is preferably provided in a thickness direction of the aluminum oxide film in such a manner that a low-density film is deposited in tens of nanometers on a near-channel side, and other film portions are deposited to have high density in order to achieve the enhancement mode and the barrier capability together. When the density gradient is not provided, density of the aluminum oxide film is preferably within a range of 2.75 g/cm$^3$ or more and less than 2.79 g/cm$^3$ in view of balance between the enhancement mode and the barrier capability.

The low-density aluminum oxide film may be used not only for the channel protective film 16 but also for the gate insulating film 13. However, when the thin film transistor is driven, since a certain electric field is applied to the gate insulating film 13, charge trapping may occur at an interface between the gate insulating film 13 and the channel (oxide semiconductor layer 14), causing hysteresis. From this point of view, the low-density aluminum oxide film is preferably used for the channel protective film 16.

The protective film 17 is formed of, for example, a single layer film of an aluminum oxide film or a silicon oxide film, or a multilayer film of an aluminum oxide film and a silicon oxide film. The aluminum oxide film used herein is a high-density aluminum oxide film typically used for a thin film transistor. Thickness of the protective film 17 is, for example, 10 to 100 nm, and preferably 50 nm or less. In the oxide semiconductor film, an electric characteristic of the film is inconveniently changed due to mixing of hydrogen or adsorption of water. However, the high-density aluminum oxide film is used as the protective film 17, so that the adverse effect of hydrogen or water may be prevented by excellent gas-barrier capability of the film. In addition, the aluminum oxide film is used as the protective film 17, and therefore the protective film may be formed without degrading an electric characteristic of oxide semiconductor.

Method of Manufacturing Thin Film Transistor 1

FIGS. 4 and 5 are diagrams for illustrating a method of manufacturing the thin film transistor 1. The thin film transistor 1 may be manufactured, for example, in the following way.

First, as shown in FIG. 4A, a metal thin film is deposited on the whole surface of the substrate 11 by a sputtering or evaporation method, and then the metal thin film is patterned by, for example, a photolithography method to form the gate electrode 12.

Next, as shown in FIG. 4B, the second layer 13B and the first layer 13A are sequentially deposited by, for example, a plasma CVD method so as to cover the substrate 11 and the gate electrode 12, so that the gate insulating film 13 is formed. Specifically, first, the second layer 13B including a silicon nitride film is deposited by a plasma CVD method using a mixed gas containing silane (SiH$_4$), ammonia (NH$_3$) and nitrogen. Then, the first layer 13A including a silicon oxide film is deposited by a plasma CVD method using a mixed gas containing silane and dinitrogen monoxide (N$_2$O) as a source gas.

Next, as shown in FIG. 4C, the oxide semiconductor layer 14 is deposited by, for example, a sputtering method. Specifically, when indium-gallium-zinc oxide (IGZO) is used as the oxide semiconductor, DC sputtering is performed with IGZO ceramics as a target. Here, it is preferable that for example, a vacuum chamber of a DC sputtering apparatus is evacuated to, for example, 1×10$^{-4}$ Pa or lower, and then a mixed gas of argon (Ar) and oxygen is introduced into the chamber for plasma discharge. Carrier concentration in the channel may be controlled by adjusting a flow rate of argon to oxygen of the mixed gas.

Alternatively, when zinc oxide is used as the oxide semiconductor, RF sputtering can be performed with zinc oxide ceramics as a target, or DC sputtering can be performed with zinc as a target in a mixed gas atmosphere of argon and oxygen. Then, the oxide semiconductor layer 14 is patterned in a desired shape by, for example, a photolithography method.

Figure 5A:
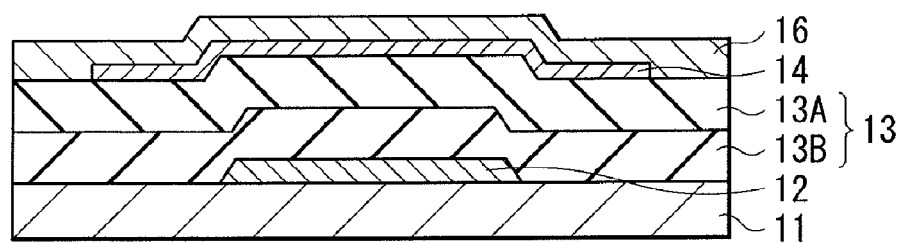
FIGS. 5A to 5C are diagrams showing steps following FIG. 4C.

Next, as shown in FIG. 5A, the channel protective film 16 including aluminum oxide having negative fixed charge is deposited on the oxide semiconductor layer 14 by, for example, DC sputtering using Al as a target. Here, it is preferable that for example, a vacuum chamber of a DC sputtering apparatus is evacuated to, for example, $1 \times 10^{-4}$ Pa or lower, and then a mixed gas of argon (Ar) and oxygen is introduced into the chamber for plasma discharge. As density of the aluminum oxide film forming the channel protective film 16 decreases, density of negative fixed charge of the film increases, so that threshold voltage of TFT may be more shifted in a positive direction. The density of the aluminum oxide film may be decreased by increasing DC power or decreasing temperature during deposition. Moreover, since the amount of fixed charge varies depending on thickness of the film, the threshold voltage may be controlled by changing the thickness depending on desired characteristics.

Figure 5B:
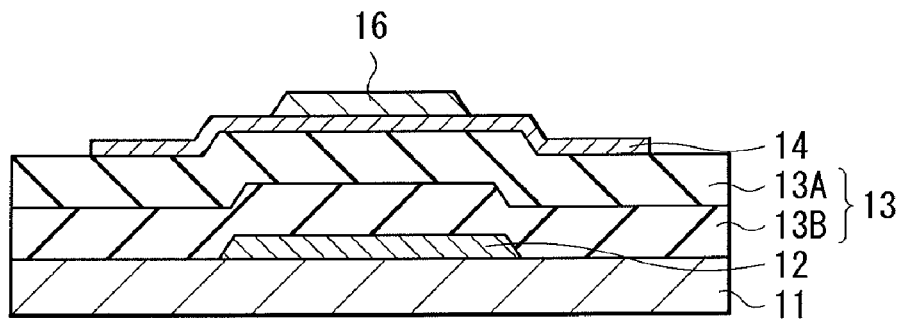

Next, as shown in FIG. 5B, the channel protective film 16 is patterned in a desired shape by, for example, a photolithography method.

Figure 5C:
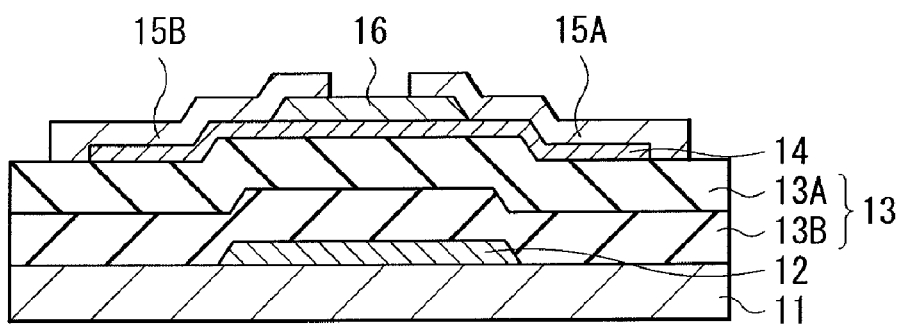

Next, as shown in FIG. 5C, a metal thin film including, for example, molybdenum, aluminum and molybdenum stacked in this order is deposited by, for example, a sputtering method on the oxide semiconductor layer 14 in a region including the channel protective film 16. Then, the metal thin film is patterned by a wet etching method using a mixed solution containing phosphoric acid, nitric acid and acetic acid. Since the channel protective film 16 protects a surface (channel surface) of the oxide semiconductor layer 14, the layer 14 may be prevented from being damaged by etching. Consequently, the source/drain electrodes 15A and 15B are formed.

Next, the protective film 17 is formed by depositing, for example, an aluminum oxide film on the source/drain electrodes 15A and 15B by, for example, a sputtering method or an atomic layer deposition (ALD) method, and therefore the thin film transistor 1 shown in FIG. 1 is completed.

Operation and Effects of Thin Film Transistor 1

Next, operation and effects of the thin film transistor 1 of the embodiment are described.

In the thin film transistor 1, when a gate voltage equal to or higher than a predetermined threshold voltage is applied to the gate electrode 12 through a not-shown wiring layer, a channel is formed in the oxide semiconductor layer 14, and thus electric current (drain current) flows between the source and drain electrodes 15A and 15B, so that the transistor 1 is activated.

In the embodiment, the channel protective film 16, including an aluminum oxide film having a density of 2.70 g/cm$^3$ or more and less than 2.79 g/cm$^3$, is provided on the oxide semiconductor layer 14 (on a side near the source/drain electrodes 15A and 15B). The aluminum oxide film having a density of less than 2.79 g/cm$^3$ is used as the channel protective film 16, so that the film 16 has negative fixed charge and thus negatively charged. Consequently, the threshold voltage of the thin film transistor 1 is shifted in a positive direction.

In this way, in the embodiment, the aluminum oxide film having a density of 2.70 g/cm$^3$ or more and less than 2.79 g/cm$^3$ is used as the channel protective film 16 provided on the oxide semiconductor layer 14, and therefore the film 16 has negative fixed charge that may shift the threshold voltage in a positive direction. Accordingly, the thin film transistor 1 using the oxide semiconductor for a channel may be controlled such that threshold voltage is sifted in a positive direction.

Example

Figure 6:
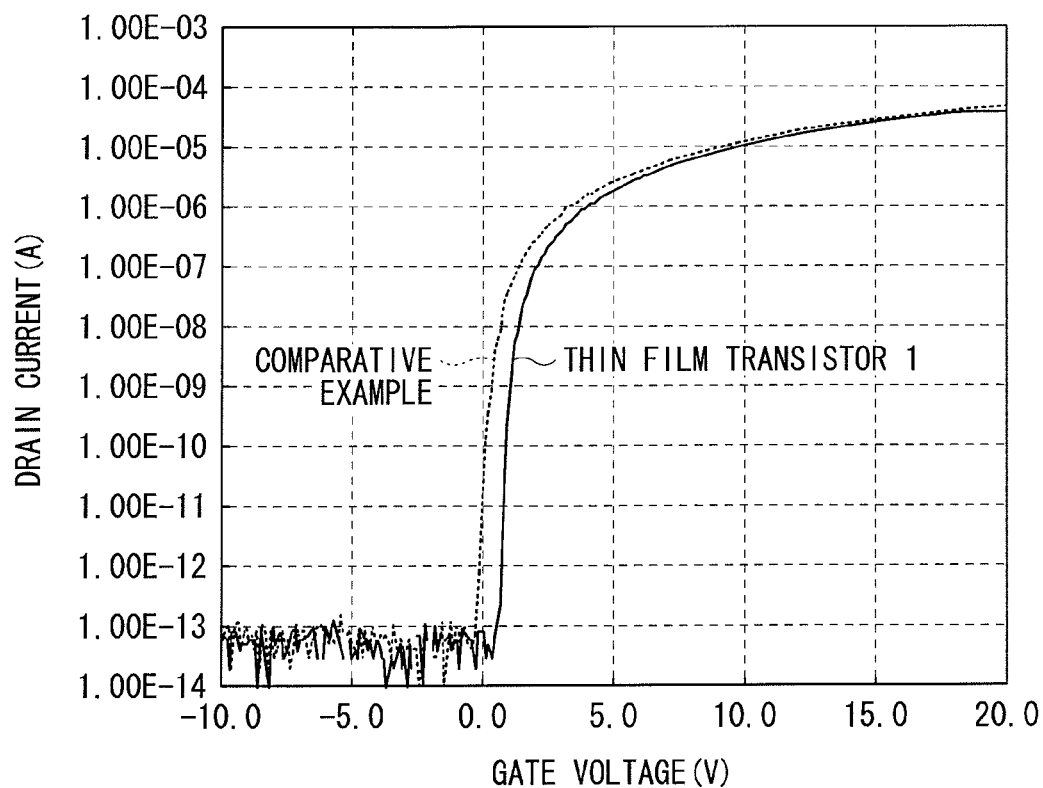
FIG. 6 is a transfer characteristic diagram of thin film transistors of an example and a comparative example.

As an example of the first embodiment, a transfer characteristic of TFT (a relationship between gate voltage and drain current) is measured. First, a transfer characteristic of TFT is measured for a channel protective film 16 of an aluminum oxide film formed into a thickness of 200 nm by DC sputtering at 80° C. and DC power of 18 kW (example), and measured for a channel protective film of a silicon oxide film formed by a plasma CVD method (comparative example). FIG. 6 shows measurements. As shown, the transfer characteristic of TFT is shifted by about 0.8 V in a positive direction in the example using the channel protective film, in which density of the aluminum oxide film is reduced so as to generate negative fixed charge, compared with the comparative example using the silicon oxide film as the channel protective film. The transfer characteristic may be controlled by adjusting density of the aluminum oxide film used as the channel protective film. Therefore, density of the aluminum oxide film is more decreased, so that the transfer characteristic may be more shifted in a positive direction.

Modification 1

Next, a thin film transistor (thin film transistor 2) according to a modification (modification 1) of the thin film transistor of the first embodiment is described. The thin film transistor 2 is bottom-gate TFT using oxide semiconductor for a channel like the thin film transistor 1 of the first embodiment. Hereinafter, the same elements as in the thin film transistor 1 of the first embodiment are designated by the same symbols, and description of them is appropriately omitted.

Figure 7:
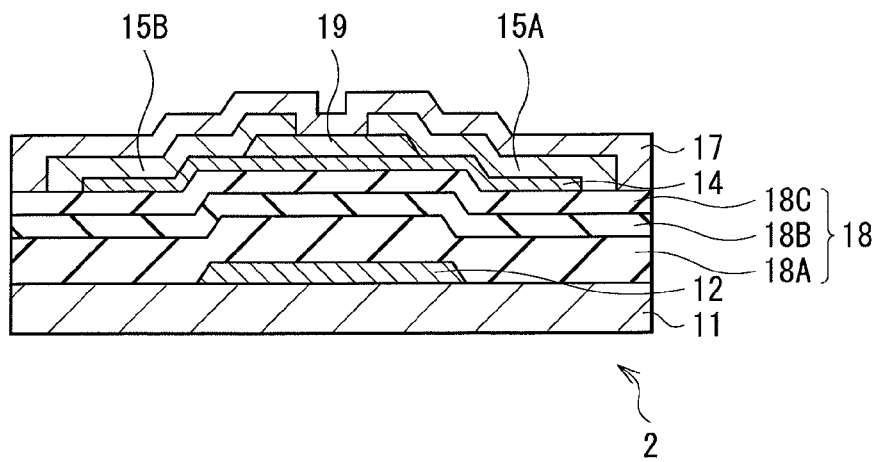
FIG. 7 is a section diagram showing a section structure of a thin film transistor according to modification 1.

FIG. 7 shows a section structure of the thin film transistor 2 according to the modification. The thin film transistor 2 includes a gate electrode 12, a gate insulating film 18, an oxide semiconductor layer 14, a channel protective film 19, source/drain electrodes 15A and 15B, and a protective film 17 formed in this order on a substrate 11 as in the first embodiment. The gate insulating film 18 is a multilayer film including, for example, three layers of a first layer 18A, a second layer 18B and a third layer 18C. Each of the first layer 18A, the second layer 18B and the third layer 18C includes a silicon oxide film, a silicon nitride film or an aluminum oxide film. Thicknesses of the first layer 18A, the second layer 18B and the third layer 18C are 300 nm, 50 nm and 10 nm, respectively.

Such a gate insulating film 18 may be formed, for example, in the following way. First, the first layer 18A including, for example, a silicon nitride film is formed by a plasma CVD method on the substrate 11, having the gate electrode 12 formed thereon, in the same way as in the embodiment. Then, a second layer 18B is formed on the first layer 18A by, for example, DC sputtering using Al as a target. Next, the third layer 18C including, for example, a silicon oxide film is formed by a plasma CVD method in the same way as in the embodiment. This results in formation of the gate insulating film 18 including the low-density aluminum oxide film, having negative fixed charge, sandwiched by silicon oxide films or silicon nitride films. The oxide semiconductor layer 14 is formed on the second layer 18B having negative fixed charge via the third layer 18C. This may reduce hysteresis caused by charge trapping at a boundary between the aluminum oxide film and the oxide semiconductor film, the charge trapping occurring when the low-density aluminum oxide film and the oxide semiconductor layer 14 are directly stacked.

In the modification, the gate insulating film 18, formed on the oxide semiconductor layer 14 on a side near the gate electrode 12, is made into a three-layer structure, and the low-density aluminum oxide film having negative fixed charge is used for the second layer 18B, so that the gate insulating film 18 has negative fixed charge, and thus threshold voltage may be shifted in a positive direction. Moreover, since the third layer 18C including silicon oxide is provided between the second layer 18B including the low-density aluminum oxide film and the oxide semiconductor layer 14, the hysteresis may be reduced. Accordingly, even if the gate insulating film 18, provided on the oxide semiconductor layer 14 on the side near the gate electrode 12, is formed of the low-density aluminum oxide film, the same effects as in the first embodiment may be obtained.

However, if a distance between the aluminum oxide film having negative fixed charge and the oxide semiconductor film increases, change in threshold voltage is inconveniently reduced in addition to reduction in hysteresis. Therefore, the distance between the aluminum oxide film and the oxide semiconductor film is preferably 5 to 10 nm.

While the first embodiment and the modification have been described with the case where one of the channel protective film and the gate insulating film of bottom-gate TFT is the low-density aluminum oxide film, both the films may be formed of the low-density aluminum oxide film.

SECOND EMBODIMENT

Figure 8:
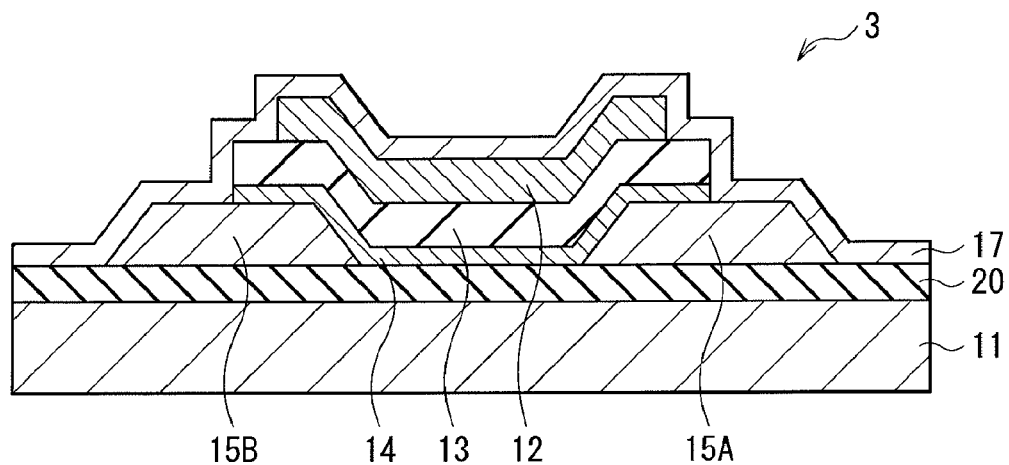
FIG. 8 is a section diagram showing a section structure of a thin film transistor according to a second embodiment.

FIG. 8 shows a section structure of a thin film transistor 3 according to a second embodiment. The thin film transistor 3 is so-called top-gate (staggered-structure) TFT, which uses oxide semiconductor for a channel. The thin film transistor 3 includes a base-coat film 20, source/drain electrodes 15A and 15B, an oxide semiconductor layer 14, a gate insulating film 13, and a gate electrode 12 formed in this order on a substrate 11 including glass or the like. A protective film 17 is formed on the gate electrode 12 over the whole surface of the substrate 11. In the second embodiment, while a configuration relationship between components is different from the bottom-gate TFT described in the first embodiment, since functions and materials of the components are the same, the components are designated by the same symbols for convenience, and description of them is appropriately omitted.

In the embodiment, the base-coat film 20 formed on the substrate 11 is a low-density aluminum oxide film. The base-coat film 20 is provided to prevent mixing of impurities from a substrate 11, and is in contact with the oxide semiconductor layer 14 via a separation groove between the source and drain electrodes 15A and 15B formed on the film 20. In other words, the base-coat film 20 is formed in contact with a channel of the oxide semiconductor layer 14.

The low-density aluminum oxide film used as the base-coat film 20 is deposited by, for example, DC sputtering using Al as a target. Here, it is preferable that, for example, a vacuum chamber of a DC sputtering apparatus is evacuated to, for example, $1 \times 10^{-4}$ Pa or lower, and then a mixed gas of argon (Ar) and oxygen is introduced into the chamber for plasma discharge. Density of the aluminum oxide film may be optionally adjusted by controlling DC power or temperature during deposition. As a specific density of the film, a density of less than 2.79 g/cm$^3$ is preferable as in the first embodiment. Thickness of the film is, for example, 50 to 300 nm.

In this embodiment, the base-coat film 20, which is in contact with the channel of the oxide semiconductor layer 14, includes the low-density aluminum oxide, so that the base-coat film 20 has negative fixed charge, and thus threshold voltage is shifted in a positive direction. Accordingly, the same effects as in the first embodiment may be obtained.

Modification 2

Figure 9:
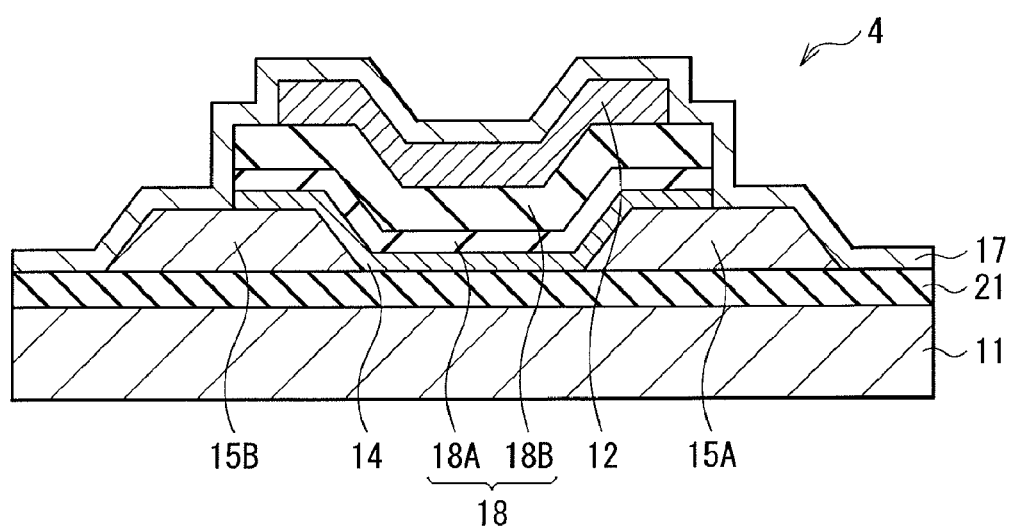
FIG. 9 is a section diagram showing a section structure of a thin film transistor according to modification 2.

FIG. 9 shows a section structure of a thin film transistor (thin film transistor 4) according to a modification (modification 2) of the second embodiment. Even in the modification, while a configuration relationship between components is different from the respective bottom-gate TFT described in the first embodiment and the modification 1, since functions and materials of the components are the same, the components are designated by the same symbols for convenience, and description of them is appropriately omitted.

The thin film transistor 4 is top-gate TFT using oxide semiconductor for a channel like the thin film transistor 3 of the second embodiment. The thin film transistor 4 includes a base-coat film 21, source/drain electrodes 15A and 15B, an oxide semiconductor layer 14, a gate insulating film 18, and a gate electrode 12 formed in this order on a substrate 11. The base-coat film 21 is formed of a silicon oxide film or the like, and the gate insulating film 18 includes low-density aluminum oxide having negative fixed charge, and is deposited by, for example, DC sputtering using Al as a target. Process temperature may be lowered so as not to form the base-coat film 21.

In the modification, the gate insulating film 18, formed on the oxide semiconductor layer 14 on a side near the gate electrode 12, includes the low-density aluminum oxide, so that the gate insulating film 18 has negative fixed charge, and therefore threshold voltage is shifted in a positive direction. Accordingly, the same effects as in the first embodiment may be obtained.

However, since a certain electric field is applied to the gate insulating film 18, when low-density aluminum oxide is used, charge trapping may occur at an interface between the oxide semiconductor layer 14 and the gate insulating film 18, causing hysteresis. Thus, the gate insulating film 18 is formed into a multilayer structure as in the modification 1, and an insulating film such as a silicon oxide film is provided between the oxide semiconductor layer 14 and the insulating film including the low-density aluminum oxide, and therefore the hysteresis may be reduced. In addition, thickness of the silicon oxide film is controlled to be 5 to 10 nm as in the modification 1, and therefore while the hysteresis is suppressed, threshold voltage of the thin film transistor may be shifted in a positive direction at about the same level as in the first embodiment. The gate insulating film 18 may have a two-layer structure. In such a case, the silicon oxide film is formed on a side near the oxide semiconductor film, and therefore the hysteresis may be reduced.

APPLICATION EXAMPLES

Next, description is made on application examples, to display devices and electronic units, of the thin film transistors according to the first and second embodiments and the modifications 1 and 2.

Display Device

Figure 10:
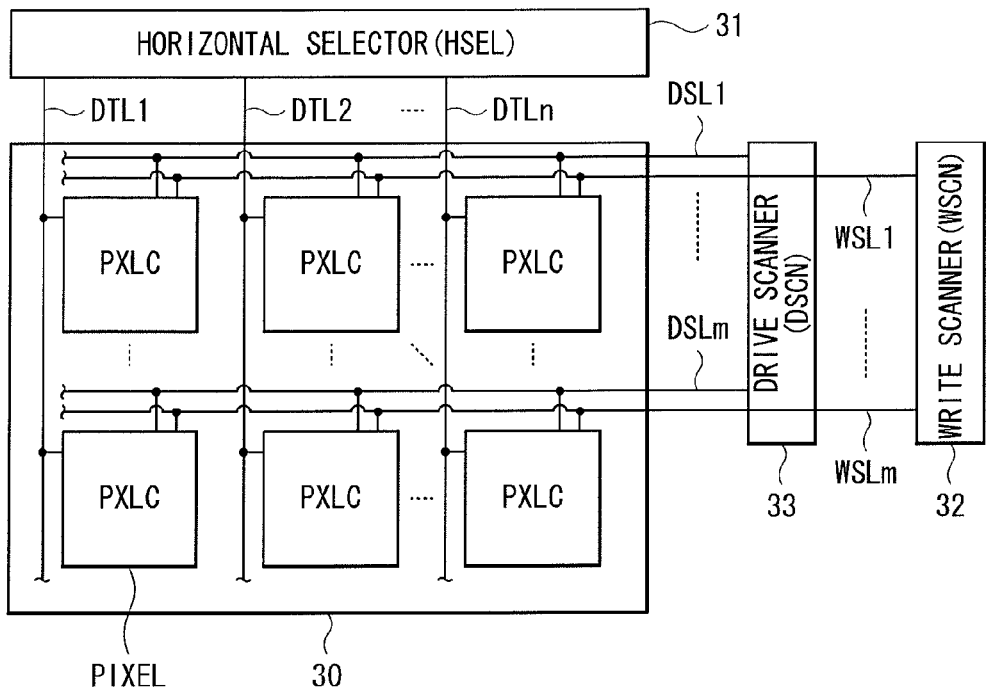
FIG. 10 is a block diagram showing a configuration example of a display device having TFT.

FIG. 10 shows a configuration example of a display device used as an organic EL display (display device using organic EL elements). For example, the display device has a display region 30, in which a plurality of pixels PXLC including organic EL elements (organic field emission elements) as display elements are arranged in a matrix on a TFT substrate (the substrate 11). A horizontal selector (HSEL) 31 as a signal line driver circuit, a write scanner (WSCN) 32 as a scan line driver circuit, and a drive scanner (DSCN) 33 as a drive line driver circuit are provided in the periphery of the display region 30.

In the display region 30, a plurality of (an integer n) signal lines DTL1 to DTLn are arranged in a column direction, and a plurality of (an integer m) scan lines WSL1 to WSLm and a plurality of (an integer m) drive lines DSL1 to DSLm are arranged in a row direction, respectively. Each pixel PXLC (one of pixels corresponding to red (R), green (G) and blue (B)) is provided at an intersection of each signal line DTL and each scan line WSL. Each signal line DTL is connected to the horizontal selector 31 that supplies a video signal to each signal line DTL. Each scan line WSL is connected to the write scanner 32 that supplies a scan signal (selection pulse) to each scan line WSL. Each drive line DSL is connected to the drive scanner 33 that supplies a drive signal (control pulse) to each drive line DSL.

Figure 11:
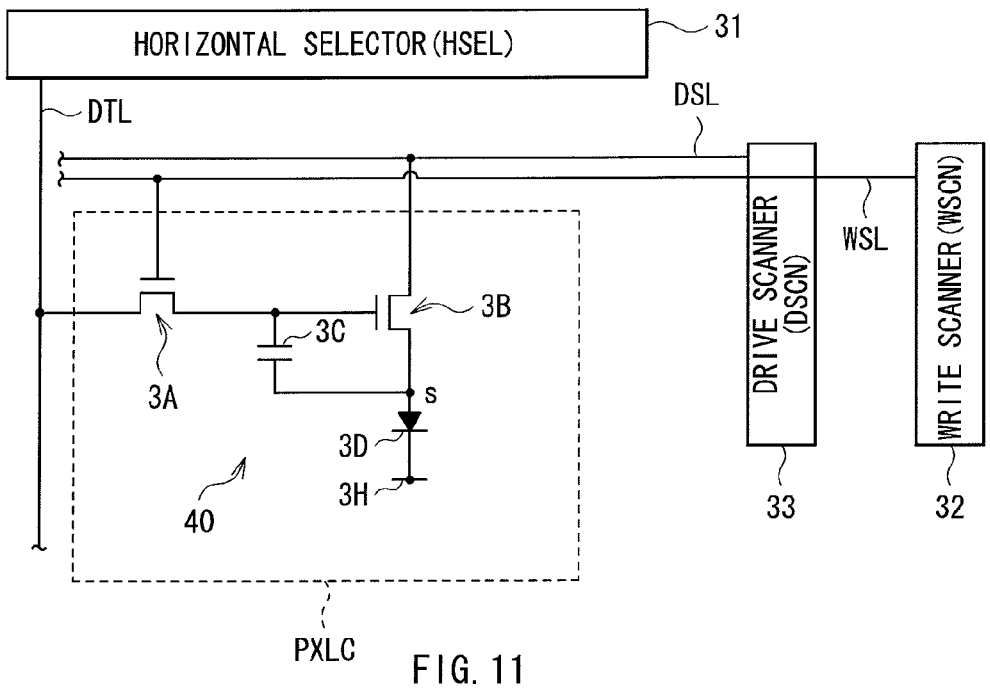
FIG. 11 is a circuit diagram showing a detailed configuration example of a pixel shown in FIG. 10.

FIG. 11 shows a circuit configuration example of the pixel PXLC. Each pixel PXLC has a pixel circuit 40 including an organic EL element 3D. The pixel circuit 40 is an active driver circuit having a sampling transistor 3A, a driver transistor 3B, a capacitance element 3C and the organic EL element 3D. The transistors 3A and 3B correspond to the thin film transistor of each of the embodiments and the like.

A gate of the sampling transistor 3A is connected to a corresponding scan line WSL, and one of a source and a drain of the transistor is connected to a corresponding signal line DTL while the other is connected to a gate of the driver transistor 3B. A drain of the driver transistor 3B is connected to a corresponding drive line DSL, and a source thereof is connected to an anode of the organic EL element 3D. A cathode of the organic EL element 3D is connected to a ground line 3H. The ground line 3H is connected in common to all the pixels PXLC. The capacitance element 3C is disposed between the source and the gate of the driver transistor 3B.

The sampling transistor 3A becomes conductive in response to a scan signal (selection pulse) supplied from a scan line WSL, and thus samples a signal potential of a video signal supplied from a signal line DTL, and holds the signal potential in the capacitance element 3C. The driver transistor 3B is supplied with current from a drive line DSL set to a predetermined first potential (not shown), and supplies to the organic EL element 3D a drive current in correspondence with the signal potential held in the capacitance element 3C. The organic EL element 3D is supplied with the drive current from the driver transistor 3B and thus emits light with luminance corresponding to the signal potential of the video signal.

In the display device, the sampling transistor 3A becomes conductive in response to a scan signal (selection pulse) supplied from a scan line WSL, and thus a signal potential of a video signal supplied from a signal line DTL is sampled and held in the capacitance element 3C. In addition, current is supplied from a drive line DSL set to the first potential to the driver transistor 3B that supplies to the organic EL element 3D (each of organic EL elements of red, green and blue) a drive current in correspondence with the signal potential held in the capacitance element 3C. Each organic EL element 3D is supplied with the drive current and thus emits light with luminance corresponding to the signal potential of the video signal. Consequently, the display device performs video display based on the video signal.

Electronic Units

Hereinafter, application examples of the display device to electronic units are described. The display device may be used for electronic units in any field, including a television apparatus, a digital camera, a notebook personal computer, a mobile terminal such as mobile phone, and a video camera. In other words, the display device may be used for electronic units in any field for displaying still or video images based on an externally-input or internally-generated video signal.

Module

Figure 12:
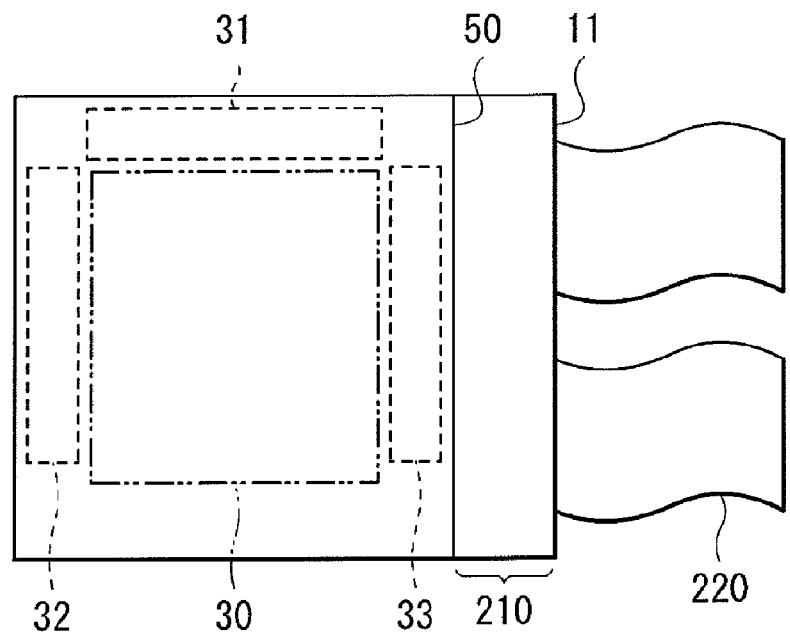
FIG. 12 is a plan diagram showing a schematic configuration of a module including the display device shown in FIG. 10.

The display device may be built in various electronic units such as those in application examples 1 to 5 described below, for example, in a form of a module shown in FIG. 12. In the module, for example, a region 210 exposed from a sealing substrate 50 is provided in one side of the substrate 11, and external connection terminals (not shown) are formed in the exposed region 210 by extending lines of the horizontal selector 31, the write scanner 32 and the drive scanner 33. The external connection terminals may be attached with a flexible printed circuit (FPC) 220 for input or output of signals.

Application Example 1

Figure 13:
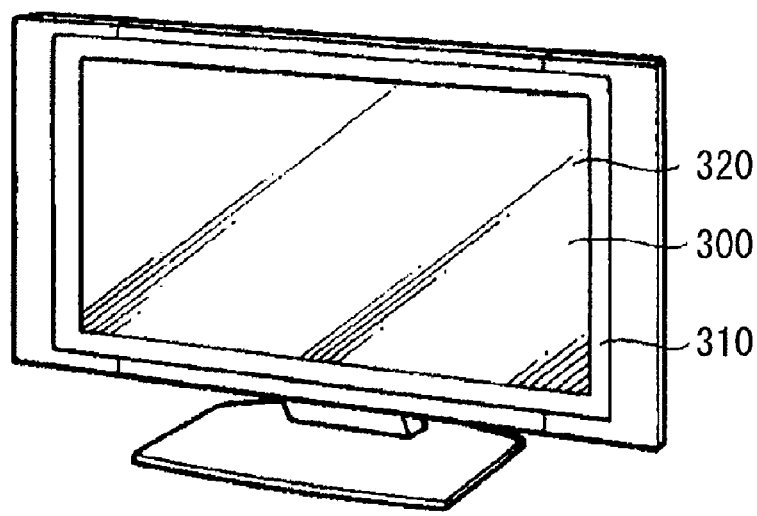
FIG. 13 is a perspective diagram showing appearance of application example 1 of the display device shown in FIG. 10.

FIG. 13 shows appearance of a television apparatus. The television apparatus has, for example, an image display screen 300 including a front panel 310 and filter glass 320, and the image display screen 300 corresponds to the display device.

Application Example 2

Figure 14A:
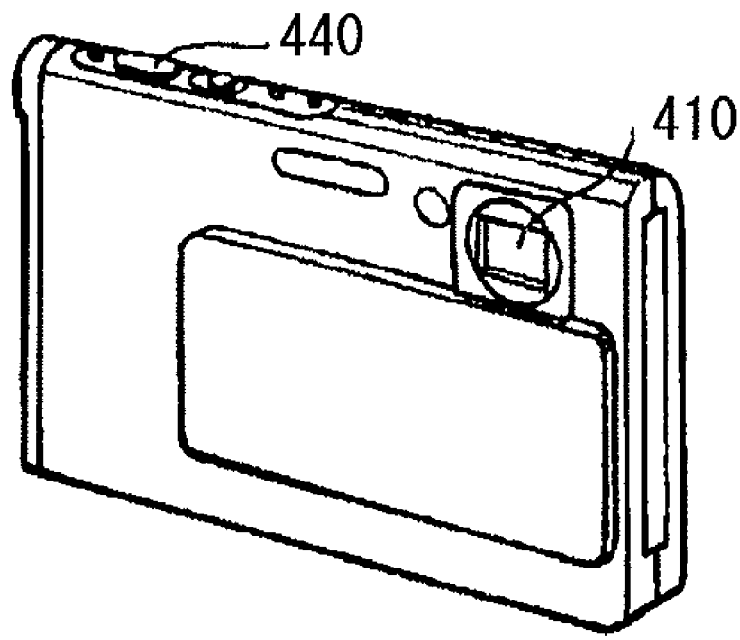
FIGS. 14A and 14B are perspective diagrams, where
Figure 14B:
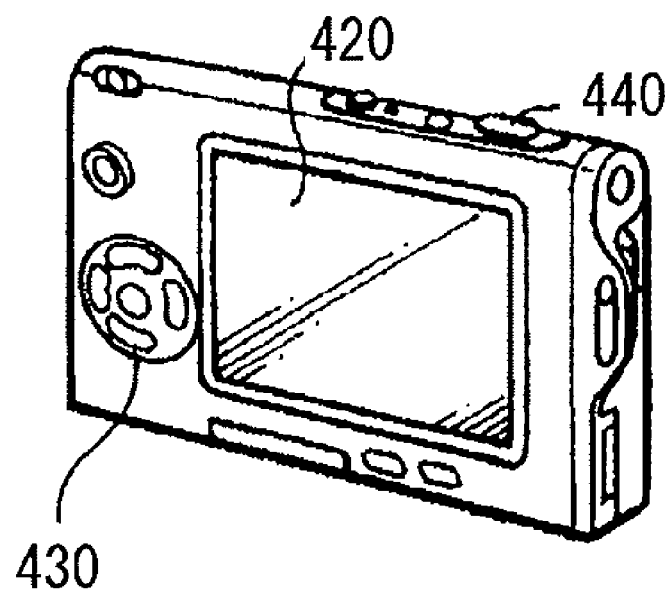

FIGS. 14A and 14B show appearance of a digital camera. The digital camera has, for example, a light emitting section for flash 410, a display 420, a menu switch 430 and a shutter button 440, and the display 420 corresponds to the display device.

Application Example 3

Figure 15:
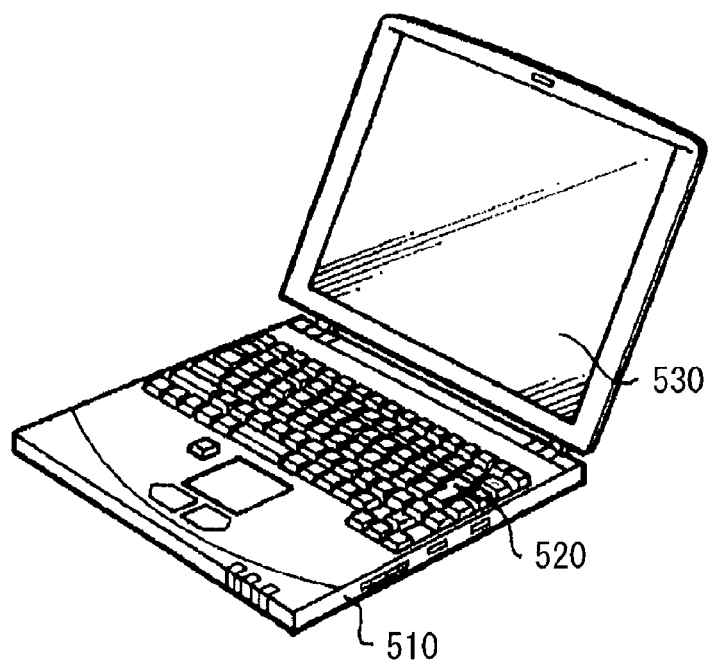
FIG. 15 is a perspective diagram showing appearance of application example 3.

FIG. 15 shows appearance of a notebook personal computer. The notebook personal computer has, for example, a body 510, a keyboard 520 for input operation of letters and the like, and a display 530 for displaying images, and the display 530 corresponds to the display device.

Application Example 4

Figure 16:
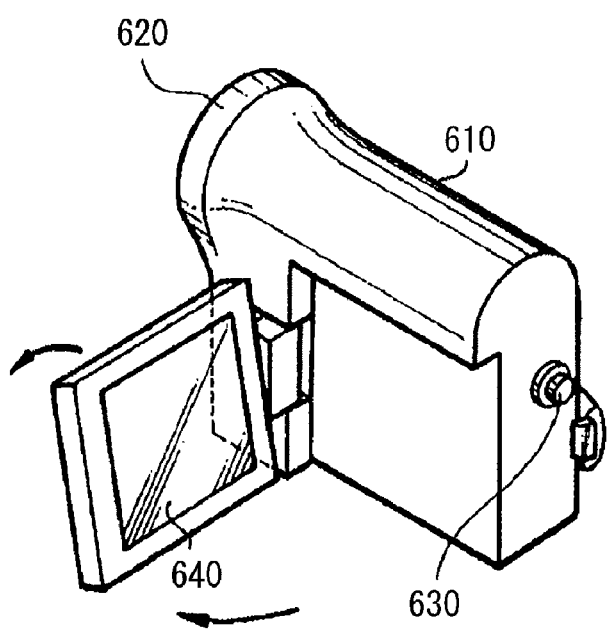
FIG. 16 is a perspective diagram showing appearance of application example 4.

FIG. 16 shows appearance of a video camera. The video camera has, for example, a body 610, an object-shooting lens 620 provided on a front side-face of the body 610, a start/stop switch 630 for shooting, and a display 640. The display 640 corresponds to the display device.

Application Example 5

FIGS. 17A to 17G show appearance of a mobile phone. For example, the mobile phone is assembled by connecting an upper housing 710 to a lower housing 720 by a hinge 730, and has a display 740, a sub display 750, a picture light 760, and a camera 770. The display 740 or the sub display 750 corresponds to the display device.

While the embodiments and the like have been described with the case as an example where a gate insulating film is a two-layer film of a silicon oxide film and a silicon nitride film, or a three-layer film including a low-density aluminum oxide film sandwiched by silicon oxide films or silicon nitride films, the gate insulating film may be formed into a single-layer structure or a multilayer structure including four or more layers.

While the embodiments and the like have been described with the case as an example where the channel protective film using low-density aluminum oxide having negative fixed charge is in contact with the oxide semiconductor layer 14, the channel protective film need not be fully contacted on the layer 14. In other words, if the low-density aluminum oxide film having negative fixed charge exists at least near the oxide semiconductor layer 14 as described in the modifications, the same effects as in the embodiments and the like may be obtained.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A thin film transistor comprising:
   a gate electrode;
   a source electrode;
   a drain electrode;
   an oxide semiconductor layer forming a channel and provided between the gate electrode and the source and drain electrodes;
   a first insulating film as a gate insulating film provided on the oxide semiconductor layer on a side near the gate electrode, and
   a second insulating film provided on the oxide semiconductor layer on a side near the source and drain electrodes,
   wherein one or both of the first insulating film and the second insulating film includes an aluminum oxide having a film density of 2.70 g/cm$^3$ or more and less than 2.79 g/cm$^3$.

2. The thin film transistor according to claim 1,
   wherein the one or both of insulating films are a single-layer film.

3. The thin film transistor according to claim 1,
   wherein the one or both of insulating films have a two-layer structure, and
   one layer includes silicon oxide or silicon nitride, and the other layer includes the aluminum oxide.

4. The thin film transistor according to claim 3,
   wherein the layer including aluminum oxide is stacked on the oxide semiconductor layer via the layer including silicon oxide or silicon nitride.

5. The thin film transistor according to claim 1,
   wherein the one or both of insulating films have a three-layer structure, and
   one layer of the insulating film includes the aluminum oxide, and other two layers include silicon oxide or silicon nitride, and sandwich the layer including the aluminum oxide.

6. The thin film transistor according to claim 1,
   wherein film density of the insulating film has a gradient in a depth direction, and the gradient of the film density is low on a side near the oxide semiconductor layer.

7. A display device including display elements and thin film transistors for driving the display elements, each of the thin film transistors comprising:
   a gate electrode;
   a source electrode;
   a drain electrode;
   an oxide semiconductor layer forming a channel and provided between the gate electrode and the source and drain electrodes;
   a first insulating film as a gate insulating film provided on the oxide semiconductor layer on a side near the gate electrode; and
   a second insulating film provided on the oxide semiconductor layer on a side near the source and drain electrodes,
   wherein one or both of the first insulating film and the second insulating film includes aluminum oxide having a film density of 2.70 g/cm$^3$ or more and less than 2.79 g/cm$^3$.

8. An electronic unit having a display device which includes display elements and thin film transistors for driving the display elements, each of the thin film transistors comprising:
   a gate electrode;
   a source electrode;
   a drain electrode;
   an oxide semiconductor layer forming a channel and provided between the gate electrode and the source and drain electrodes;
   a first insulating film as a gate insulating film provided on the oxide semiconductor layer on a side near the gate electrode; and
   a second insulating film provided on the oxide semiconductor layer on a side near the source and drain electrodes,
   wherein one or both of the first insulating film and the second insulating film includes aluminum oxide having a film density of 2.70 g/cm$^3$ or more and less than 2.79 g/cm$^3$.

* * * * *